United States Patent
Azdasht

[19]

[11] Patent Number: 5,938,951

[45] Date of Patent: *Aug. 17, 1999

[54] METHOD AND APPARATUS FOR THE BONDING OF A CONTACT ELEMENT

[75] Inventor: Ghassem Azdasht, Berlin, Germany

[73] Assignee: Fraunhofer-Gesellschaft zur Forschung E.V., Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/564,352

[22] PCT Filed: Jun. 16, 1994

[86] PCT No.: PCT/DE94/00677

§ 371 Date: Dec. 14, 1995

§ 102(e) Date: Dec. 14, 1995

[87] PCT Pub. No.: WO95/00283

PCT Pub. Date: Jan. 5, 1995

[30] Foreign Application Priority Data

Jun. 17, 1993 [DE] Germany .............................. 43 20 058
Jun. 17, 1993 [DE] Germany .............................. 43 20 057

[51] Int. Cl.$^6$ .................................................. B23K 26/02
[52] U.S. Cl. ............................... 219/121.64; 219/121.83; 219/121.85; 385/91
[58] Field of Search .......................... 219/121.63, 121.64, 219/121.65, 121.66, 121.85, 121.83; 385/91, 134; 156/272.8; 264/1.24, 1.25, 1.27

[56] References Cited

U.S. PATENT DOCUMENTS

| | | | |
|---|---|---|---|
| 3,463,898 | 8/1969 | Takaoka et al. | 219/121.63 |
| 4,357,072 | 11/1982 | Goodfellow et al. | 385/91 |
| 4,854,667 | 8/1989 | Ebata et al. | 385/134 |
| 4,946,246 | 8/1990 | Shiga | 385/91 |
| 4,970,365 | 11/1990 | Chalco | 219/121.63 |
| 5,178,723 | 1/1993 | Nguyen | 156/285 |
| 5,421,506 | 6/1995 | Kooijman et al. | 228/103 |

FOREIGN PATENT DOCUMENTS

| | | |
|---|---|---|
| 0314113 | 5/1989 | European Pat. Off. . |
| 0356988 | 3/1990 | European Pat. Off. . |
| 0423433 A 1 | 4/1991 | European Pat. Off. . |
| 4200492 | 4/1993 | Germany . |
| 4200492 A 1 | 4/1993 | Germany . |
| 4137508 | 5/1993 | Germany . |
| 4137508 A 1 | 5/1993 | Germany . |
| 60-162574 | 8/1985 | Japan . |
| 62-23003 | 1/1987 | Japan . |
| 62-134173 | 6/1987 | Japan . |
| 4-320090 | 11/1992 | Japan . |
| 2022280 | 12/1979 | United Kingdom . |

OTHER PUBLICATIONS

PCT International Search Report PCT/DE94/00677, Jun. 16, 1994.

*Primary Examiner*—Gregory Mills
*Attorney, Agent, or Firm*—Larry L. Saret; Laff, Whitesel, Conte & Saret, Ltd.

[57] ABSTRACT

Method and apparatus for bonding a contact element (17) on a substrate (20), in which the contact element is held by a connecting device designed, in particular, as a bonding head (11) and the contact element or the substrate or both are loaded with thermal energy, wherein the contact element rests on the substrate when loaded with energy and a relative movement takes place between the contact element and the substrate, reference energy issuing from an emission surface (28) and transmitted to the contact element (17) is measured during the relative movement as a reference value for the quality of the relative position of the contact element (17), and the relative movement and the energy loading are interrupted when an adequate reference value is measured.

2 Claims, 3 Drawing Sheets

METHOD AND APPARATUS FOR THE BONDING OF A CONTACT ELEMENT

The present invention relates to a method and an apparatus for the bonding of a contact element on a substrate.

An apparatus and a method for the production of a laser diode arrangement is known from EP-A-356988, in which the exact relative positioning between one end of an optical fibre and a laser diode takes place in the molten state of connection solder as a function of a peak of the radiation energy transmitted from the laser diode into the optical fibre. Devices which are independent from one another, namely a positioning manipulator and a soldering piston are used for positioning and connection by the known method.

BACKGROUND OF THE INVENTION

The object of the present invention is to provide a method and an apparatus of the type mentioned at the outset which simplify the bonding of a contact element on a substrate.

This object is achieved by a method and an apparatus having the features of the invention.

SUMMARY OF THE INVENTION

With the method according to the invention, the contact element is held by a connecting device which is designed as a bonding head and is at the same time used for the positioning and energy loading of the contact element.

To enable the supply of energy or the interruption thereof to be controlled particularly exactly, energy loading by a laser source has proven particularly advantageous as the laser energy can be introduced into the connecting region at a precisely defined point by means of an optical fibre arrangement, and the introduction of energy by energy radiation allows substantially delay-free shut off without a buffer effect, as is the case, for example, with thermal conduction.

It is particularly advantageous if the method according to the invention is applied during the coupling of an optical fibre to an element which emits laser energy, for example, a laser diode, the laser energy outlet surface of the element arranged on the substrate serving as emmission surface and the contact element being provided by the optical fibre. Application of the method according to the invention allows substantially loss-free coupling of the optical fibre to the laser diode. The laser energy which is emitted from the laser energy outlet surface of the laser diode and is introduced into the optical fibre provided for coupling to the laser diodes is used as reference energy. The reference energy issuing from the optical fibre can be measured to determine the optimum relative position, the optimum relative position being obtained when the issuing energy reaches its peak. Therefore, the application of the method in the production of a diode laser arrangement with optical fibre coupling allows efficiency of the diode laser arrangement barely attainable hitherto.

To allow simple pre-adjustment of the contact element, which corresponds to the optical fibre when applying the method to the production of a diode laser arrangement, relative to the emission surface on the substrate, the contact element cross section can be received at least partially in a positioning device. This positioning device determines the limits within which relative positioning of the contact element with respect to the emission surface is possible and therefore avoids an excessively large positional deviation between the contact element and the emission surface which would unnecessarily lengthen the duration of implementation of the method.

In the case of a metallic design of the outer periphery of the contact element, that is the optical fibre cladding, the positioning device can have at least two contact metallization mounds known as so-called bumps. This type of positioning device has the advantage that the positioning device itself provides the connecting material required for the thermal connection between the contact element and the substrate.

In particular when the method is used for the bonding of a contact element designed as a wire conductor, it may prove advantageous to superimpose ultrasonic energy on the thermal energy for the energy loading of the contact element.

The features of the invention relate to an apparatus which is particularly suitable for carrying out the aforementioned method.

With this apparatus there is provided a connecting device which is designed as a bonding head and is connected via an optical fibre arrangement to a laser source, the bonding head being provided with a device, preferably designed as a vacuum device, for holding the contact element on the bonding head. The apparatus also comprises an energy measuring device which can be connected to the contact element for measuring reference energy transmitted from an energy emission device arranged on the substrate to the contact element. The apparatus also comprises a substrate carrier for receiving the substrate.

The relative movement between the contact element and the substrate necessary for carrying out the method according to the invention can be permitted by appropriate mobility of the bonding head. However, it is also possible to provide a substrate carrier which is correspondingly movable, that is movable at least in one axial direction of the connecting plane between the contact element and the substrate transversely to the direction of emitted reference energy. This enables the bonding head itself to be relatively simple in design and a conventional compound table or the like which allows extremely precise adjustments in the axial directions of movement to be used for the movable substrate carrier arrangement.

The optical fibre arrangement in the bonding head can be brought internally up to an energy transmitting member of the bonding head of which the external surface serves to load the contact element with pressure and heat. Such a design of the bonding head allows a build up of heat to be created at the interface between the transmission member and the contact element, which can be used to connect the contact element to the substrate, particularly when using, for the transmission member, materials having a thermal capacity which is as low as possible.

A design of the energy transmission member which is independent of the bonding head also allows the energy transmission member to be adapted to the respective material constitution of the contact element and to be exchanged when different contact elements are used on the bonding head. The use of energy transmission members has the further advantage that, despite uniform application of pressure in the region of the connecting point on the contact element, direct contact between the optical fibre arrangement in the bonding head and the contact element is avoided, preventing the associated wear on the end cross section of the optical fibre arrangement.

It can prove advantageous, particularly when a transmission member is interposed between the optical fibre arrangement and the contact element, if the bonding head is additionally loaded with ultrasonic vibrations so as to introduce ultrasonic energy into the connecting point in addition to thermal energy.

A preferred embodiment of the method according to the invention and advantageous embodiments of the apparatus for carrying out the method are described in detail with reference to the following drawings.

DETAILED DESCRIPTION OF THE PREFERRED EMBODIMENTS

Figure 1:
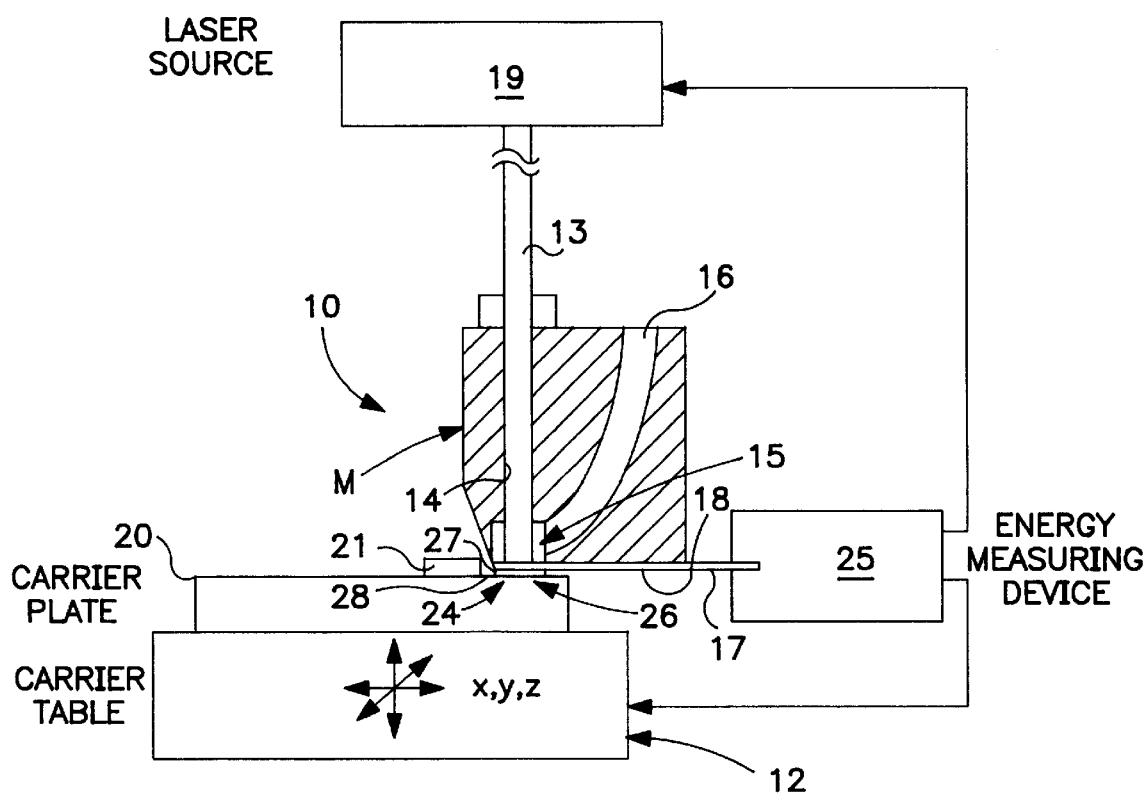
FIG. 1 is a schematic view of a possible embodiment of an apparatus for carrying out a variation of the method according to the invention.

FIG. 1 shows a first embodiment of a bonding apparatus 10 with a bonding head 11 and a substrate carrier table 12 which is arranged beneath the bonding head 11 and is movable in the direction of the X, Y and Z axes. In a receiving bore in the bonding head 11 there is introduced a glass fibre line 13 which is provided with a radiation screen (not shown in detail) and is connected to a laser source 19. At its lower end, the receiving bore 14 is enlarged to a vacuum chamber 15 from which there issues a suction line 16 connected to a suction device (not shown in detail here). The vacuum chamber 15 serves to aspirate and hold a contact element designed here as an optical fibre 17 against a lower face 18 of the bonding head 11.

Figure 2:
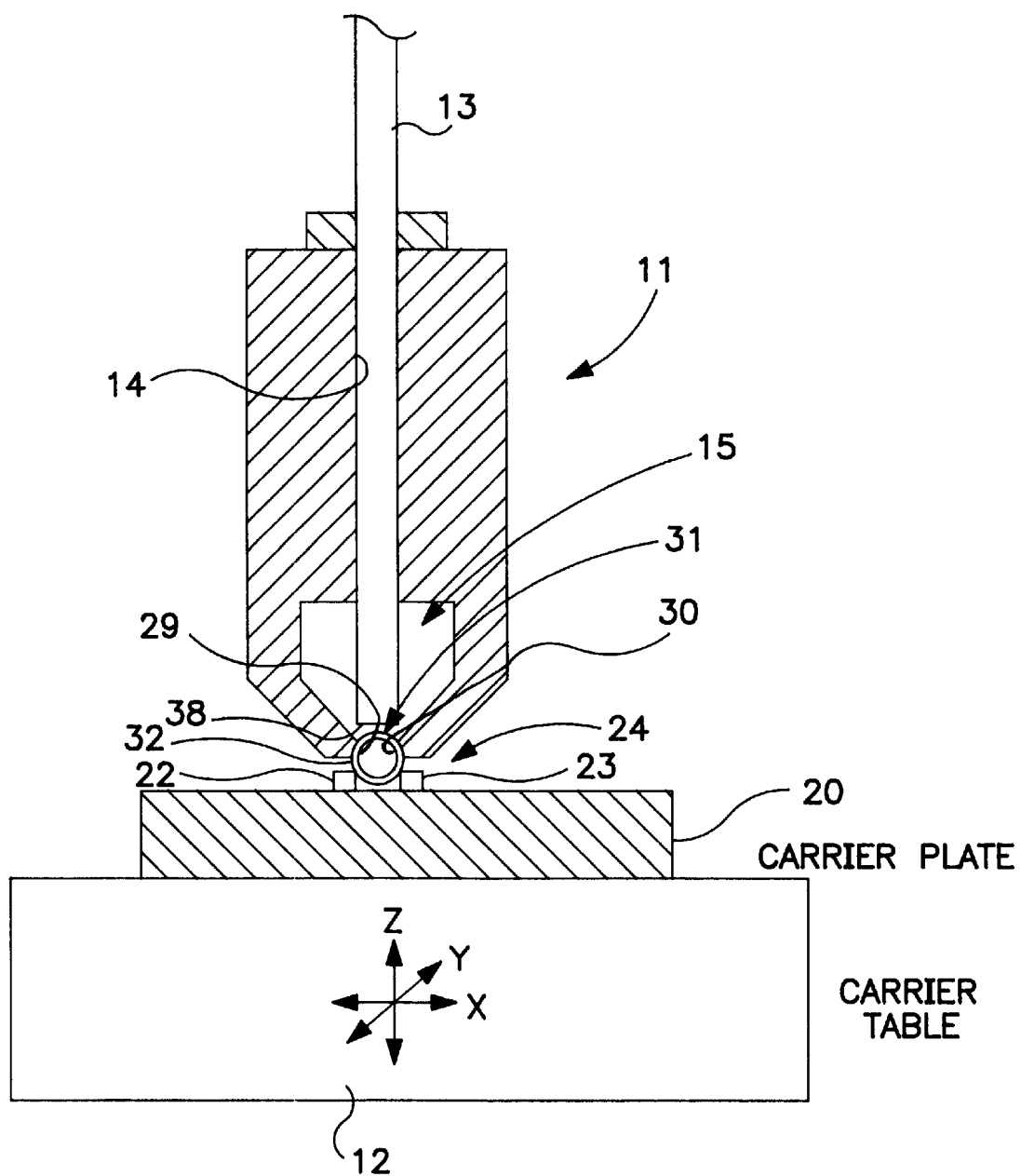
FIG. 2 is an enlarged partial view of the apparatus shown in FIG. 1.

On the substrate carrier table 12 there is arranged a substrate which is designed in this case as a carrier plate 20 and on which there are located a laser diode 21 rigidly connected thereto and two soldering bumps 22, 23 which are at a distance from the laser diode 21 and together form a positioning device 24 (FIG. 2). For holding the carrier plate 20 securely on the substrate carrier table 12, the substrate carrier table 12 is provided in a manner not shown in detail here with an aspiration device.

To the optical fibre 17 there is connected an energy measuring device 25 which can be connected to the bonding head 11 or can form a separate device and is connected in terms of signalling on the one hand to the laser source 19 and on the other hand to the substrate carrier table 12.

A possible variation of the method of bonding the optical fibre 17 to the carrier plate 20 will be described in detail hereinafter with reference to FIGS. 1 and 2. The object of the connection, described here by way of example, between the optical fibre 17 and the carrier plate 20 is to produce a diode laser arrangement 26 in which laser radiation emitted from the laser diode 21 is to be introduced into the optical fibre 17 and to be conveyed onward through it to an optional radiation outlet point. It is important for a radiation inlet cross section 27 of the optical fibre 17 to be orientated exactly with respect to an emission surface 28 of the laser diode 21 so that the introduction of the laser radiation into the radiation inlet cross section 27 can take place as far as possible without losses. Direct connection between the emission surface 28 and the radiation inlet cross section 27 should be avoided as any deformations occurring could lead to radiation losses. It is important for the performance of the diode laser arrangement 26 for the emission surface 28 of the laser diode 21 amounting merely to about 2 µm in diameter in the case of the laser diode selected as an example to be orientated relative to the optical fibre 17 in such a way that its projection lies within the core cross section of the optical fibre 17 which forms the radiation inlet cross section 27 and is about 5 to 6 µm in diameter in this embodiment.

The substrate carrier table 12 with the carrier plate 20 arranged thereon is initially driven in the direction of the Z axis toward the optical fibre 17 held on the bonding head 11 by vacuum in such a way that the configuration shown in FIG. 2 is adjusted. Preadjustment is permitted in that the optical fibre 17 is received with its cross section partially between the soldering bumps 22, 23 of the positioning device 24. In the embodiment illustrated, the soldering bumps 22, 23 have a substantially rectangular cross section, but can also have any other design if desired. To orientate the optical fibre 17 relative to the bonding head 11, the lower end thereof is substantially funnel shaped in design and receives the optical fibre 17 with its periphery between two duct edges 29, 30 of an optical fibre duct 31 simultaneously forming the orifice of the vacuum chamber 15 to the exterior. An end cross section 38 of the glass fibre line 13 is located a short distance from the optical fibre 17 but can also rest on it.

The laser source 19 is activated on the basis of the configuration shown in FIG. 2, which leads to an output of laser radiation from the end cross section 38 of the glass fibre line 13 and corresponding heating of the optical fibre 17 located therebelow and provided with a metal cladding 32 in this embodiment. The heat is conveyed via the metal cladding 32 into the soldering bumps 22, 23, causing them to soften. The softening of the soldering bumps 22, 23 leads to release of the rigid positioning, so movements of the substrate carrier table 12 together with the carrier plate 20 arranged thereon are now possible in the direction of the X axis. Pressure contact between the bonding head 11 and the substrate carrier table 12 which is guided via the optical fibre 17 is maintained during these movements so the positioning of the optical fibre 17 in the direction of the Z axis is also maintained relative to the substrate carrier table 12.

During the relative movement between the optical fibre 17 and the substrate carrier table 12, the laser diode 4 is activated and emits laser radiation via its emission surface 28 toward the radiation inlet cross section 27 of the optical fibre 17. The portion of emitted radiation energy which enters the optical fibre 17 and is transmitted by it is measured by the energy measuring device 25 connected to the optical fibre 17. When the radiation peak is detected, the relative movement between the optical fibre 17 and the substrate carrier table 12 is interrupted and the laser source 19 is switched off. Both are carried out via appropriate signals conveyed from the energy measuring device 25 to an adjusting device (not shown in detail) of the substrate carrier table 12 and the laser source 19.

The switching off of the laser source 19 which can be carried out constantly or intermittently and the interruption in the relative movement during the softened state of the soldering bumps 22, 23 results in quasi freezing of the optimum relative position, defined by the measured radiation peak, of the radiation inlet cross section 27 of the optical fibre 17 with respect to the emission surface 28 of the laser diode 21. After solidification of the connection between the carrier plate 20 and the optical fibre 17, an extremely powerful laser diode arrangement is created. It will be appreciated that corresponding optimum positioning in the direction of the Y axis is possible in the same manner as optimization of the relative position of the optical fibre 17 with respect to the laser diode 21 in the direction of the X axis.

To connect an optical fibre which is not provided with metallic cladding but, for example, with acrylic cladding to the carrier plate 20, the positioning aids of the positioning device 24 designed as soldering bumps 22, 23 in the foregoing example can be formed from a corresponding plastics material which allows thermal connection to the optical fibre. It is similarly possible to apply the method described hereinbefore in a variation not only for the production of diode laser arrangements but quite generally whenever positioning of a contact element on a substrate which is as accurate as possible is to be effected. It is then possible to use, not a laser diode, but an energy emitting device of a quite general type, for example a current-carrying conductor with a contact cross section, as emission surface. The electric current measured in the contact element can then also be measured, for example, in relation to the introduced electric current as a reference value for the correct relative positioning. A bonding apparatus 39 of the type shown in FIG. 3 can then also be used. In a modification of a known wedge-bond method, the energy required for the thermal connection is introduced as in the above-described embodiment via a glass fibre line 13 into a bonding head 33 modified in comparison with the aforementioned embodiment.

In contrast to the above-described method and the apparatus used for it, the bonding head 33 is provided with an energy transmitting member 34 which is arranged between the end cross section 38 of the glass fibre line 13 and the periphery of the contact element designed here as a wire conductor 35. In the embodiment illustrated here, the substrate is provided by a chip 36 having a soldering bump 37 for connection to the wire conductor 35. A non-melting partial area of the soldering bump 34 can be provided as an emission surface in the embodiment illustrated here.

Figure 3:
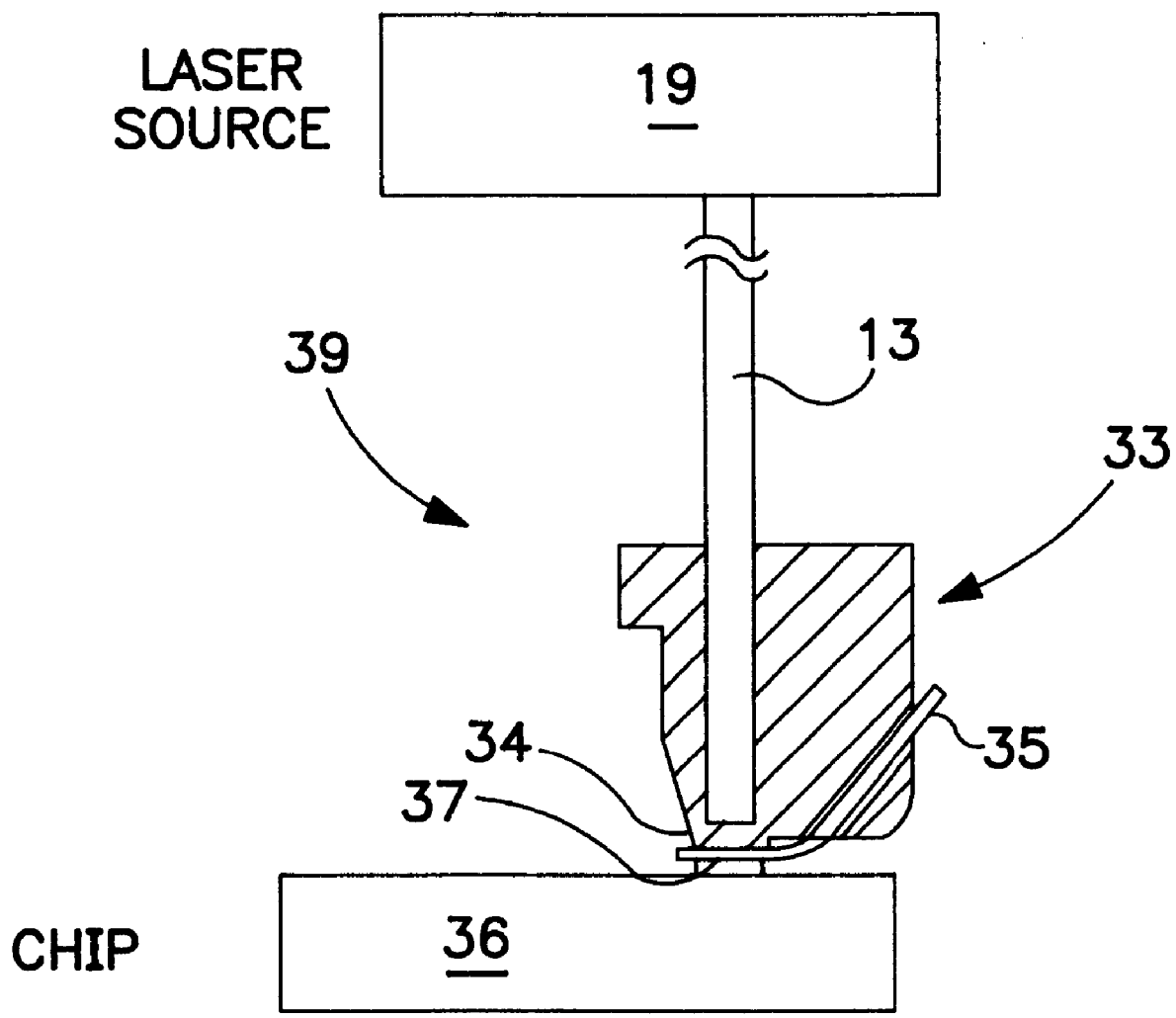
FIG. 3 shows a possible variation of the apparatus shown in FIG. 1.

It will be appreciated that the apparatus shown in FIG. 3 generally affords advantages for the connection of contact elements to a substrate surface which, in turn, can also be formed by a contact element, independently of the monitoring of the relative position between the contact element and the substrate, as described in detail with reference to FIGS. 1 and 2. The interposition of the energy transmission member 34 between the end cross section 38 of the glass fibre line 13 and the periphery of the wire conductor 35 with appropriate choice of material for the transmission member results in a build up of heat and therefore to a local rise in temperature in the region of contact between the energy transmission member 34 and the wire conductor 35, so the connection can be made particularly effectively. This applies in particular when loading with ultrasonic energy is superimposed on the thermal loading of the connecting point.

The invention claimed is:

1. Method of bonding a contact element on a substrate, in which the contact element is loaded with thermal energy and wherein the contact element rests on the substrate while energy is being loaded, comprising:

preadjusting the position of the contact element in front of an energy emission surface of an element emitting energy by inserting the contact element's cross section between at least two spaced contact metallization mounds arranged on the substrate;

beginning loading of thermal energy in order to soften the metallization mounds sufficiently to permit movement of the contact element relative to the substrate;

moving the contact element and the substrate relative to each other for a fine positioning of the contact element on the substrate during loading of thermal energy;

issuing reference energy from said energy emission surface and transmitting the energy to the contact element during the relative movement;

measuring the reference energy during the relative movement as a reference value for the quality of the position of the contact element; and halting the relative movement and the energy loading when an adequate reference value is measured, wherein the contact element is held by a bonding head which is simultaneously used for the fine positioning and energy loading of the contact element.

2. The method of claim 1 further comprising the preliminary step of arranging said metallization mounds on said substrate in front of said energy emission surface, providing a guide for preadjusting the position of said contact element.

\* \* \* \* \*